US008093659B2

(12) United States Patent
Nuttinck

(10) Patent No.: US 8,093,659 B2
(45) Date of Patent: Jan. 10, 2012

(54) THREE-DIMENSIONAL STACKED-FIN-MOS DEVICE WITH MULTIPLE GATE REGIONS

(75) Inventor: Sebastien Nuttinck, Heverlee (BE)

(73) Assignee: NXP B.V., Eindhoven (NL)

( * ) Notice: Subject to any disclaimer, the term of this patent is extended or adjusted under 35 U.S.C. 154(b) by 394 days.

(21) Appl. No.: 12/161,709

(22) PCT Filed: Jan. 22, 2007

(86) PCT No.: PCT/IB2007/050211
§ 371 (c)(1),
(2), (4) Date: Jul. 22, 2008

(87) PCT Pub. No.: WO2007/085996
PCT Pub. Date: Aug. 2, 2007

(65) Prior Publication Data
US 2010/0219479 A1      Sep. 2, 2010

(30) Foreign Application Priority Data
Jan. 30, 2006   (EP) .................................... 06101021

(51) Int. Cl.
*H01L 21/762*  (2006.01)
*H01L 27/12*   (2006.01)

(52) U.S. Cl. . 257/369; 257/347; 257/366; 257/E29.264; 438/585

(58) Field of Classification Search .................. 257/369, 257/331, 347, 350, 365, 366
See application file for complete search history.

(56) References Cited

U.S. PATENT DOCUMENTS

| | | | |
|---|---|---|---|
| 6,894,337 B1 | 5/2005 | Wang et al. | |
| 6,911,697 B1 | 6/2005 | Wang et al. | |
| 6,974,983 B1 | 12/2005 | Hill et al. | |
| 2002/0125536 A1 | 9/2002 | Iwasa et al. | |
| 2003/0183859 A1* | 10/2003 | Gnadinger | 257/295 |
| 2003/0193065 A1 | 10/2003 | Fried et al. | |
| 2005/0239242 A1 | 10/2005 | Zhu et al. | |
| 2005/0269645 A1 | 12/2005 | Kato | |
| 2007/0161170 A1* | 7/2007 | Orlowski et al. | 438/197 |

FOREIGN PATENT DOCUMENTS

FR      2861501 A1      4/2005

OTHER PUBLICATIONS

Chan P C H et al; "Three-Dimensional Stacked-Fin-CMOS Integrated Circuit Using Double Layer SOI Material". Solid-State and Integrated Circuits Technology, 2004. Proceedings. 7th International Conference on Beijing, China, Oct. 18-21, 2004. Piscataway, NJ, USA, IEEE, USA. pp. 81-85.

* cited by examiner

*Primary Examiner* — Ha Tran T Nguyen
*Assistant Examiner* — Raj R Gupta

(57) ABSTRACT

The invention provides a three-dimensional stacked fin metal oxide semiconductor (SF-MOS) device (10,30) comprising a protrusion or fin structure with a plurality of stacked semiconductor regions (3,5,12), in which a second semiconductor region (5,12) is separated from a first semiconductor region (3,5) by an isolation region (4,11). A gate isolation layer (8) extends at least over the sidewalls of the protrusion (7) and a gate electrode extends over the gate isolation layer (8). The gate electrode comprises a plurality of gate regions (13,14,15) wherein each gate region (13,14,15) extends over another semiconductor region (3,5,12). In this way each gate region (13,14,15) influences the conduction channel of another semiconductor region (3,5,12) and hence adds another degree of freedom with which the performance of the SF-MOS device (10,30) can be optimized. The invention further provides a method of manufacturing the SF-MOS device (10,30) according to the invention.

9 Claims, 5 Drawing Sheets

THREE-DIMENSIONAL STACKED-FIN-MOS DEVICE WITH MULTIPLE GATE REGIONS

Figure 1:
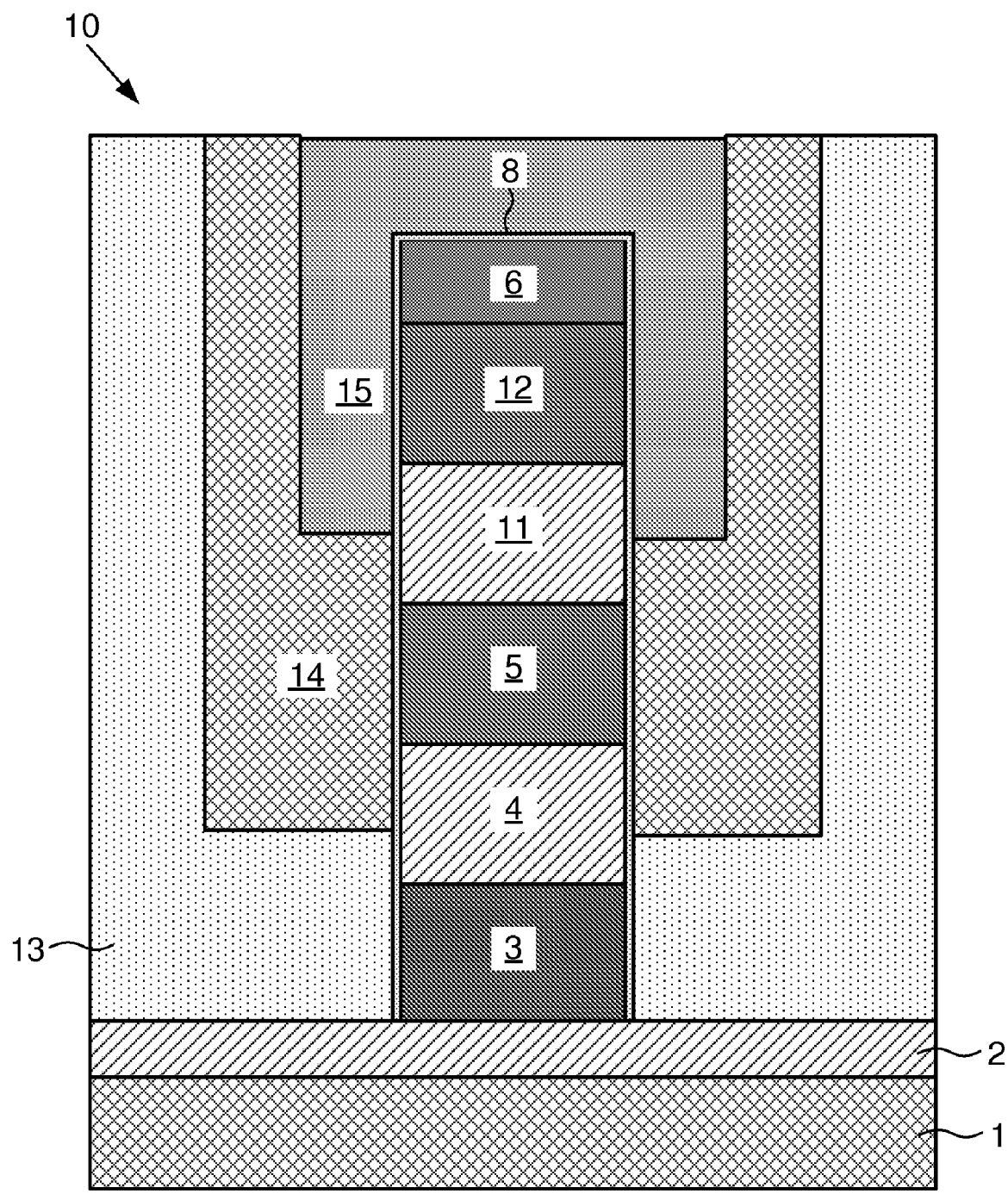

The invention relates to a MOS device and a method of fabrication a MOS device.

In "Three-dimensional stacked-fin-CMOS integrated circuit using double layer SOI material" by Philip C. H. Chan, Xusheng Wu, Shengdong Zhang, Chuguang Feng and Mansun Chan, published on the International Conference on Solid-State and Integrated-Circuit Technology, Oct. 18-21, 2004, Beijing, China, a three-dimensional stacked fin-complementary metal oxide semiconductor (SF-CMOS) device is disclosed. The SF-CMOS device comprises an n-type MOS (NMOS) device stacked on a p-type MOS (PMOS) device in a single fin structure or protrusion. A gate electrode extends over a gate oxide layer, which extends over the protrusion. The gate electrode is shared by the NMOS device and the PMOS device and is able to induce a conduction channel, or current path, in the NMOS device and the PMOS device at each sidewall of the protrusion. Because the gate electrode is shared by the NMOS device and the PMOS device it is difficult to optimize and further improve the performance of the SF-CMOS device. For example, an optimum ratio of the on-state current and the off-state current of the NMOS device and the PMOS device in the SF-CMOS device is difficult to achieve.

It is an object of the invention to provide a MOS device with an improved performance. The invention provides a MOS device as claimed in claim 1. Advantageous embodiments are defined by the dependent claims.

The MOS device according to the invention comprises a protrusion having sidewalls on a semiconductor substrate. The protrusion comprises a plurality of stacked semiconductor regions, in which a second semiconductor region is separated from a first semiconductor region by an isolation region. A gate isolation layer extends at least over the sidewalls of the protrusion, and a gate electrode extends over the gate isolation layer. The gate electrode comprises a plurality of gate regions wherein each gate region extends over another semiconductor region. Each gate region influences the conduction channel of a separate semiconductor region thereby adding a degree of freedom with which the performance of the MOS device can be improved.

In an embodiment of the MOS device according to the invention at least one of the gate regions has a work function with a value different from the work function value of the other gate regions. The work function of a material is the energy difference between the energy at the Fermi level and the free-electron energy (or vacuum level), or in other words the energy needed to move an electron from the Fermi level to the vacuum level in that material. By applying a material to one of the gate regions that has a work function with a value different from the work function value of the material used for the other gate regions, a degree of freedom is introduced with which the performance of the MOS device can be improved.

In another embodiment of the MOS device according to the invention the protrusion further comprises a hard mask region on the plurality of stacked semiconductor regions. The hard mask region is defined by photolithographic techniques and prevents a region from being removed by, for example, an etching process. This embodiment reduces the influence of the gate region that extends over the top surface of the protrusion, and consequently the top surface of the plurality of stacked semiconductor regions, thereby securing that the conduction channel is only present on the sidewalls of each semiconductor region by preventing that the conduction channel is also present on the top surface of the plurality of stacked semiconductor regions.

An embodiment of the MOS device according to the invention comprises a PMOS device and an NMOS device wherein the protrusion comprises a stack of the first semiconductor region, the isolation region and the second semiconductor region. Furthermore, the gate electrode comprises a first gate region extending over the first semiconductor region and a second gate region extending over the second semiconductor region. In this way a CMOS device is obtained wherein the conduction channel of the first and the second semiconductor region are influenced by the first and second gate region respectively, thereby adding a degree of freedom with which the performance of the CMOS device can be improved, for example the ratio between the on-state and off-state current.

In a favorable embodiment the first semiconductor region and the first gate region form the NMOS device, and the second semiconductor region and the second gate region form the PMOS device. In this embodiment the current carrying capability of the PMOS device is increased because the conduction channel is also present at the top surface of the second semiconductor region and therefore contributes to the total current of the PMOS device in addition to the conduction channels at the sidewalls of the second semiconductor region.

In another favorable embodiment the first semiconductor region and the first gate region form the PMOS device, and the second semiconductor region and the second gate region form the NMOS device. The hard mask region, which is in this embodiment present on the second semiconductor region, prevents the conduction channel from being generated at the top surface of the second semiconductor region, which minimizes the differences between the NMOS and PMOS device. A favorable gate material in this embodiment comprises platinum silicide for the first gate region and tantalum carbide for the second gate region.

A method of fabricating the CMOS device according to the invention, comprises the steps of:

forming a protrusion on a semiconductor substrate, the protrusion having sidewalls and comprising a stack of a first semiconductor region, an isolation region and a second semiconductor region;

forming a gate isolation layer extending at least over the sidewalls of the protrusion;

forming a first gate region extending over the protrusion;

selectively removing a portion of the first gate region that extends over the second isolation region the first gate region thereby extending over the first semiconductor region; and forming a second gate region that extends over the second semiconductor region.

By selectively removing a portion of the first gate region, a gate electrode is fabricated, which comprises two different gate regions.

These and other aspects of the invention will be further elucidated and described with reference to the drawings, in which:

FIG. 1 is a diagrammatic cross-sectional view of an embodiment of the MOS device according to the invention; and FIGS. 2-9 are diagrammatic cross-sectional views illustrating the sequence of steps involved in fabricating an embodiment of the MOS device according to the invention.

The Figures are not drawn to scale. In general, identical components are denoted by the same reference numerals in the Figures.

FIG. 1 illustrates a MOS device, in this case a three-dimensional stacked fin-MOS (SF-MOS) device 10 on an isolation layer 2, for example silicon dioxide, which is on a silicon substrate 1. The SF-MOS device 10 comprises a protrusion or fin structure, which comprises a stack of a first silicon region 3, a first silicon dioxide region 4, a second silicon region 5, a second silicon dioxide region 11, a third silicon region 12 and a nitride hard mask region 6. The first, second and third silicon regions 3,5,12 are preferably lowly doped regions for a width of the protrusion which is smaller than approximately 35 nm. However, higher doping levels may be applied when the width of the protrusion becomes too large to enable a true finFET device operation. A gate oxide layer 8 extends over the protrusion, for example silicon dioxide. A first gate region 13 extends over the first silicon region 3 and partly over the first silicon dioxide region 4. A second gate region 14 extends over the second silicon region 5, over the remaining part of the first silicon dioxide region 4 over which the first gate region 13 does not extend, and is in direct electrical contact with the first gate region 13. A third gate region 15 extends over the hard mask region 6, the third silicon region 12, over the remaining part of the second silicon dioxide region 11 over which the second gate region 14 does not extend, and is in direct electrical contact with the second gate region 14. The SF-MOS device 10 comprises in this embodiment three different MOS devices: a first MOS device comprising the first silicon region 3 and the first gate region 13, a second MOS device comprising the second silicon region 5 and the second gate region 14, and a third MOS device comprising the third silicon region 12 and the third gate region 15. When the silicon regions 3,5,12 are lowly doped, the influence of the work function of the gate material on each MOS device is larger than when the silicon regions 3,5,12 have a higher doping level. So, the work function of each gate region determines if each MOS device is p-type or n-type, the size of the influence of the work function depending on the doping level of the silicon regions 3,5,12. If the value of the work function is above 4.5 eV the corresponding MOS device will be p-type, and if the value of the work function is below 4.5 eV the corresponding MOS device will be n-type. Examples of gate material with a work function above 4.5 eV (PMOS device) are: PtSi (4.9 eV), MoOx (5.0 eV), TiN (4.8 eV) and TiSix (4.6 eV). Examples of gate material with a work function below 4.5 eV (NMOS device) are: TaC (4.2 eV) and TaNx (4.3 eV). By applying the right gate material for each gate region 13,14,15, any combination of NMOS devices and PMOS devices can be realized, for example a combination of three NMOS devices, or a combination of one PMOS device and two NMOS devices. Furthermore, it is possible to have PMOS devices that have a different work function, and hence a different threshold voltage. Similarly, NMOS devices can be made with different threshold voltages. The difference in work functions of the first, second and third gate region 13,14,15 enables an optimization of the SF-MOS device 10, for example an optimization of the ratio of the on-state current and the off-state current of the SF-MOS device 10, which comprises the first, second and third MOS devices each having a gate region with a different or identical value of the work function. It should be noted that the material used for the insulation regions and the semiconductor regions may be chosen differently.

Figure 2:
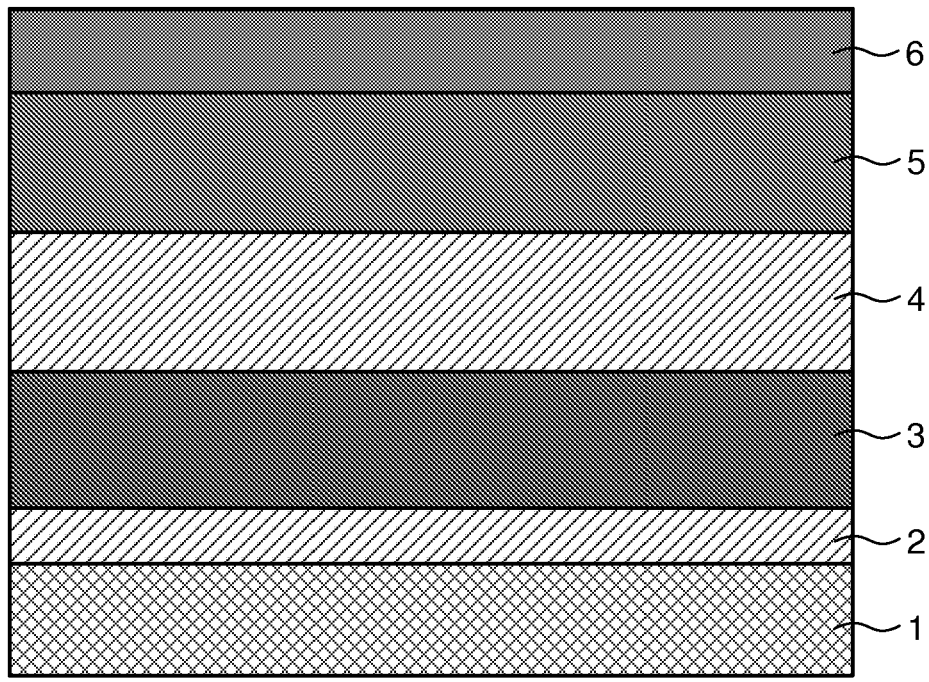

FIGS. 2-9 show cross-sectional views of a method of fabricating an embodiment of the SF-MOS device according to the invention, in this case an SF-CMOS device 30. The method starts with a silicon substrate 1 on which an isolation layer 2, for example silicon dioxide, extends, as is illustrated in FIG. 2. On the isolation layer 2 a stack is formed, using conventional methods, comprising a first silicon region 3, a silicon dioxide region 4, a second silicon region 5 and a hard mask region 6, in this case of silicon nitride. The silicon regions 3,5 are preferably lowly doped regions, whereby the doping level may depend on the width of the protrusion 7.

Figure 3:
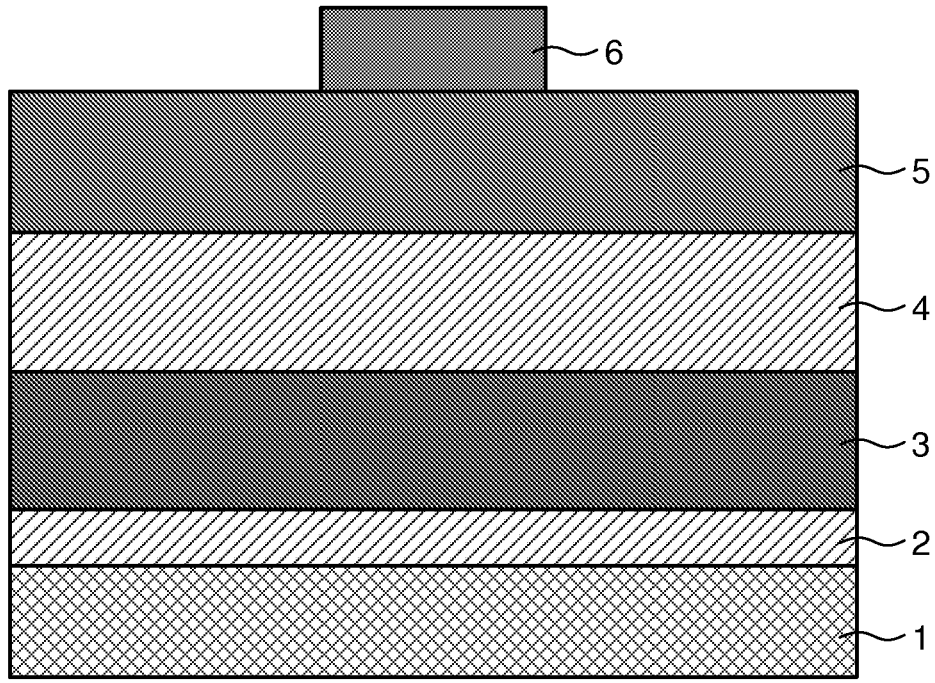

As is illustrated in FIG. 3, a portion of the hard mask region 6 is removed by applying conventional lithographic and etching techniques. The remaining portion of the hard mask region 6 defines the to be fabricated protrusion 7.

Figure 4:
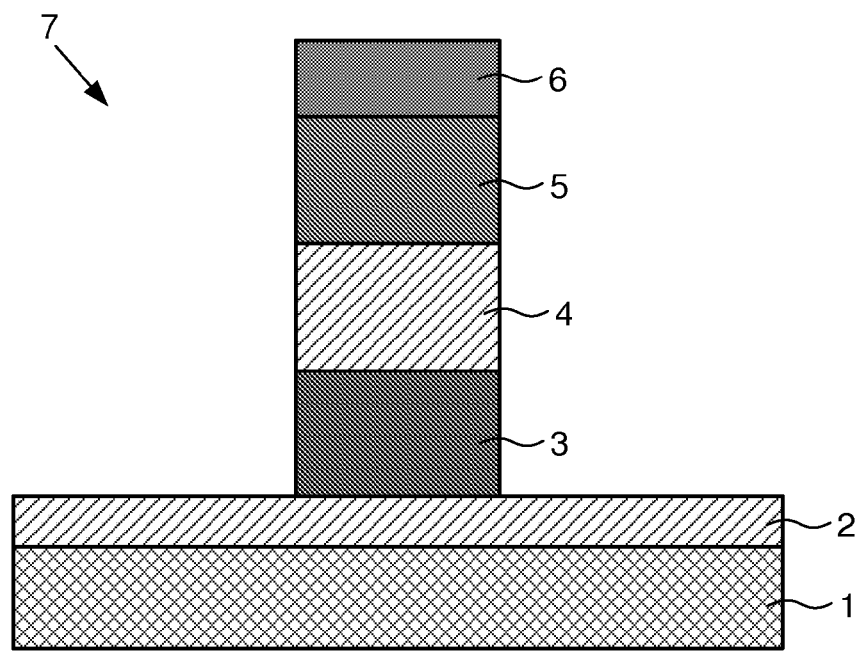

FIG. 4 illustrates the formation of the protrusion 7 by etching respectively the exposed portions of the second silicon region 5, the silicon dioxide region 4 and the first silicon region 3. The hard mask region 6 is of a silicon nitride material because during the formation of the protrusion 7, silicon dioxide is etched while the hard mask region 6 should not be etched. It is obvious that other suitable insulating materials may be applied for the hard mask region 6 and the silicon dioxide region 4. Optionally the hard mask region 6 may be removed at this stage using conventional techniques. This provides for a surface conduction channel in the second silicon region 5.

Figure 5:
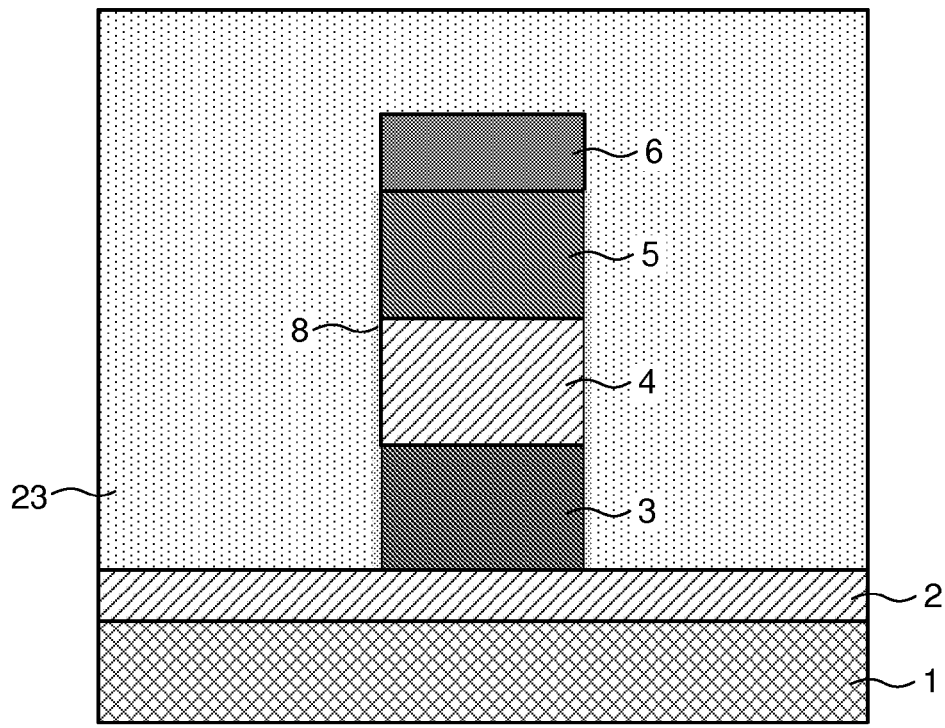

Then, as illustrated in FIG. 5, a gate oxide layer 8 is formed on the protrusion 7. Because in this example thermal growth of silicon dioxide is applied to form the gate oxide layer 8, the gate oxide layer 8 is not formed on the silicon nitride hard mask region 6. Subsequently a planarized gate region 23 is formed extending over the protrusion 7, by using conventional planarizing techniques, such as for example Chemical Mechanical Planarization (CMP). The planarized gate region 23 for example comprises PtSi, MoOx, TiN, TiSix, TaC, TaNx or any other material, which is suitable as a gate material. At this stage an SF-CMOS device is formed comprising one gate region, in this case the planarized gate region 23, which influences the conduction channel of both the first and the second silicon regions 3,5 simultaneously.

Figure 6:
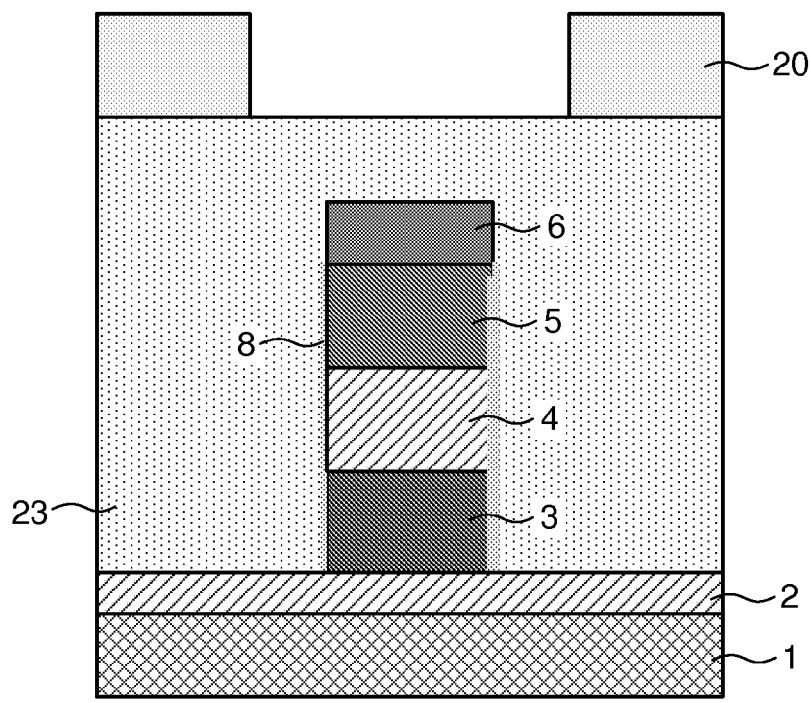

The next step is illustrated in FIG. 6 and comprises the formation of a second hard mask region 20, for example of silicon nitride, using conventional lithographic and etching techniques.

Figure 7:
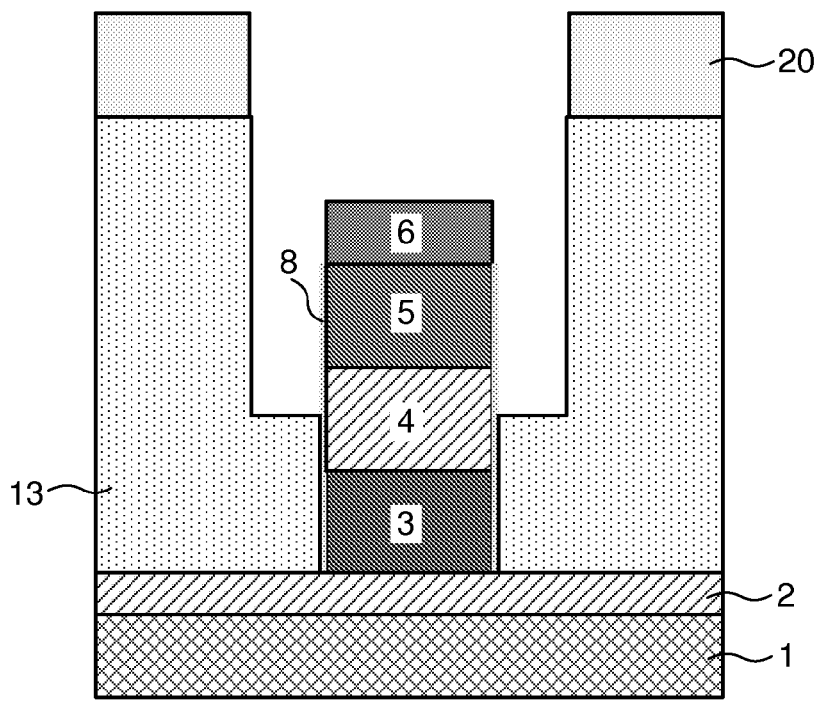

Then etching techniques are applied that remove a portion of the planarized gate region 23, such that a first gate region 13 is formed that extends over the first silicon region 3 and that does not extend over the second silicon region 5, as is illustrated in FIG. 7. The second hard mask region 20 thus defines the region where the planarized gate region 23 is partially removed. The thus formed first gate region 13 will also extend over a first portion of the silicon dioxide region 4.

Figure 8:
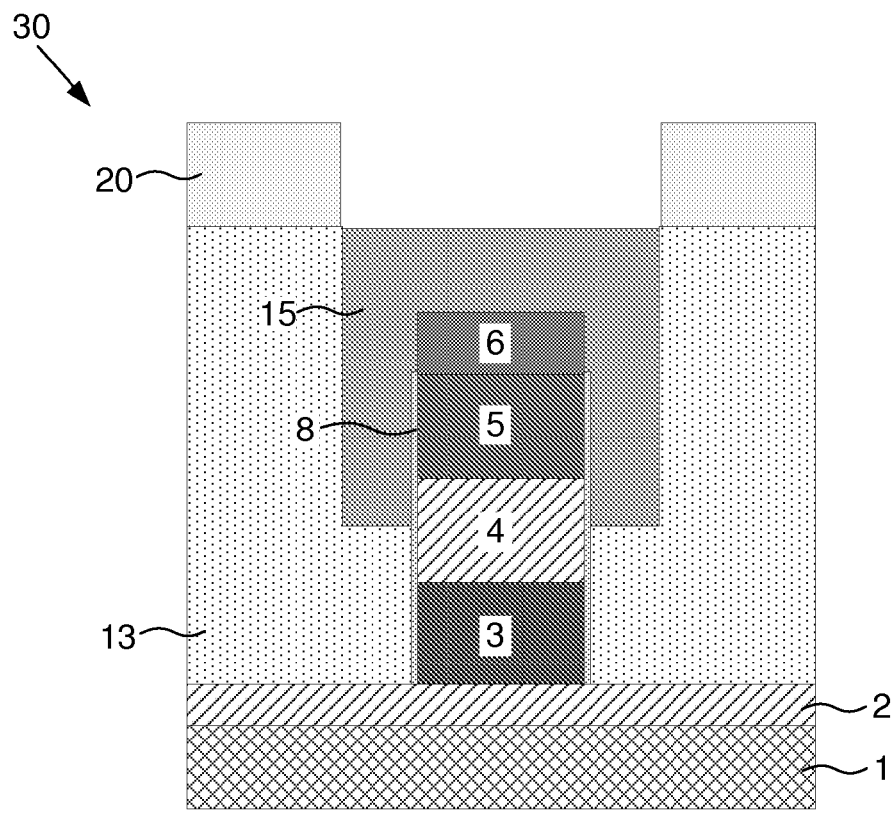

A second gate region 15 is formed on the exposed gate oxide layer 8 and the exposed first gate region 13, as is illustrated in FIG. 8. The formation of the second gate region 15 can be done by sputtering or CVD (Chemical Vapor Deposition). Also the second gate region 15 for example comprises PtSi, MoOx, TiN, TiSix, TaC, TaNx or any other material, which is suitable as a gate material.

Figure 9:
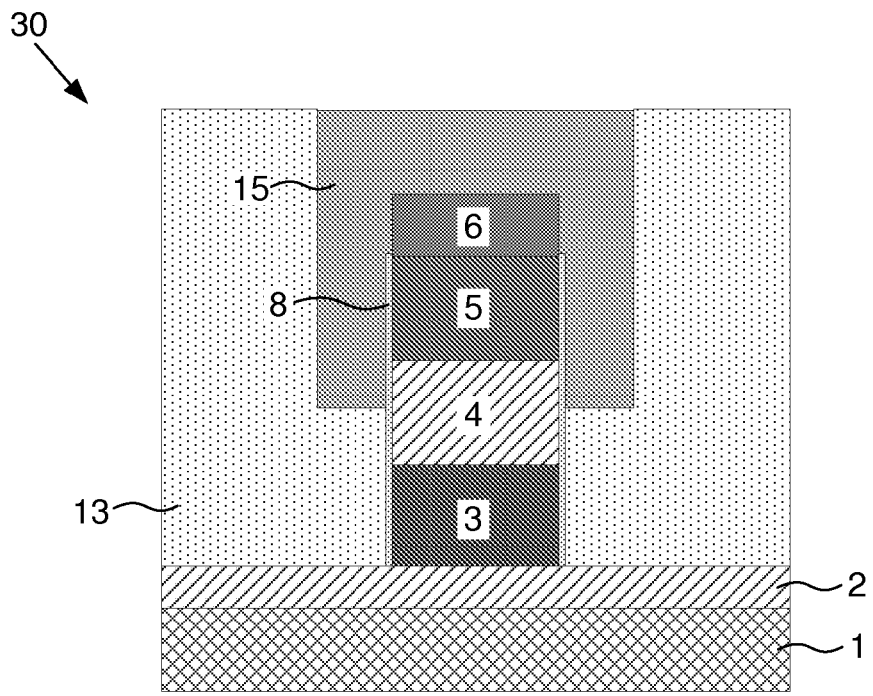

Finally the second hard mask region 20 is removed and the SF-CMOS device 30, as illustrated in FIG. 9, is obtained.

In summary, the invention provides a three-dimensional stacked fin metal oxide semiconductor (SF-MOS) device comprising a protrusion or fin structure with a plurality of stacked semiconductor regions, in which a second semiconductor region is separated from a first semiconductor region by an isolation region. A gate isolation layer extends at least over the sidewalls of the protrusion and a gate electrode extends over the gate isolation layer. The gate electrode comprises a plurality of gate regions wherein each gate region extends over another semiconductor region. This way each gate region influences the conduction channel of another semiconductor region and hence adds another degree of freedom with which the performance of the SF-MOS device can be optimized. The invention further provides a method of manufacturing the SF-MOS device according to the invention.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of other elements or steps than those listed in a claim. The word "a" or "an" preceding an element does not exclude the presence of a plurality of such elements.

The invention claimed is:

1. An integrated circuit comprising:
a plurality of stacked semiconductor regions forming a protrusion on a semiconductor substrate, wherein the stacked semiconductor regions comprise at least first and second semiconductor layers, wherein each semiconductor layer corresponds to a separate MOS device;
a gate isolation layer disposed at sidewalls of the protrusion; and
a plurality of separate gate material layers disposed over the gate isolation layer, wherein each gate material layer is aligned at the gate isolation layer with a single corresponding semiconductor layer within the protrusion to form a corresponding MOS device.

2. The integrated circuit of claim 1, further comprising an isolation layer disposed on the semiconductor substrate between the semiconductor substrate and the protrusion.

3. The integrated circuit of claim 1, wherein the separate gate material layers have different work function values.

4. The integrated circuit of claim 1, wherein the protrusion further comprises a hard mask region on the plurality of stacked semiconductor regions.

5. The integrated circuit of claim 1, wherein the MOS devices comprise:
a PMOS device, wherein a first gate material layer forms a gate electrode of the PMOS device; and
an NMOS device, wherein a second gate material layer forms a gate electrode of the NMOS device.

6. The integrated circuit of claim 1, further comprising an isolation layer within the protrusion, wherein the isolation layer separates the semiconductor layers within the protrusion.

7. The integrated circuit of claim 6, wherein each gate material layer only partially overlaps the isolation layer of the protrusion.

8. The integrated circuit of claim 1, wherein the separate gate material layers comprise different semiconductor materials.

9. The integrated circuit of claim 8, wherein at least one of the gate material layers comprises platinum silicide, and another of the gate material layers comprises tantalum carbide.

* * * * *